(12) United States Patent
Shi et al.

(10) Patent No.: US 6,641,702 B2
(45) Date of Patent: Nov. 4, 2003

(54) SPUTTERING DEVICE

(75) Inventors: Jian Zhong Shi, Singapore (SG); Jian Ping Wang, Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 09/965,080

(22) Filed: Sep. 26, 2001

(65) Prior Publication Data
US 2002/0074225 A1 Jun. 20, 2002

(30) Foreign Application Priority Data
Sep. 26, 2000 (SG) ........................................ 200005437-9

(51) Int. Cl.[7] ............................................... C23C 14/35
(52) U.S. Cl. ............................ 204/192.12; 204/298.18; 204/298.19; 204/298.23; 204/298.25; 204/298.26; 204/298.28; 204/298.29
(58) Field of Search ................. 204/298.12, 298.18, 204/298.19, 298.2, 298.23, 298.25, 298.26, 298.28, 298.29, 192.12

(56) References Cited

U.S. PATENT DOCUMENTS

| | | | | |
|---|---|---|---|---|
| 3,853,740 A | * | 12/1974 | Kunz ..................... | 204/298.23 |
| 4,933,057 A | * | 6/1990 | Sebastiano et al. .... | 204/192.12 |
| 5,968,328 A | | 10/1999 | Teschner et al. ....... | 204/298.25 |
| 6,051,113 A | * | 4/2000 | Moslehi ................. | 204/192.12 |
| 6,077,406 A | | 6/2000 | Kawakubo et al. .... | 204/298.12 |
| 6,103,069 A | * | 8/2000 | Davenport ............. | 204/192.12 |
| 6,235,171 B1 | * | 5/2001 | Yamamoto ............. | 204/298.25 |
| 6,251,232 B1 | * | 6/2001 | Aruga et al. ........... | 204/192.32 |

FOREIGN PATENT DOCUMENTS

| | | | |
|---|---|---|---|
| JP | 60-262969 | * | 12/1985 |
| JP | 5-78831 | * | 3/1993 |
| JP | 9-31638 | * | 2/1997 |

OTHER PUBLICATIONS

Austrian Patent Office Search Report, Apr. 30, 2002.

* cited by examiner

Primary Examiner—Rodney G. McDonald
(74) Attorney, Agent, or Firm—Jenkens & Gilchrist, P.C.

(57) ABSTRACT

The present invention is directed to a sputtering device for depositing multi-layer films on a substrate, the sputtering device comprising at least one planar-magnetron-sputtering-cathode and at least one facing-targets-sputtering-cathode housed in a single vacuum chamber, and adapted such that each planar-magnetron-sputtering-cathode and facing-targets-sputtering-cathode can be selectively positioned for sputtering deposition onto a substrate.

43 Claims, 6 Drawing Sheets

SPUTTERING DEVICE

BACKGROUND OF THE INVENTION

1. Field of the Invention

The present invention relates generally to a sputtering device, and more particularly to an integrated device for forming multi-layer thin film structures on a substrate, and to a method for depositing at least one layer of film on a substrate using such a device.

2. Description of Related Art

Coating of a substrate by sputtering is a well established art. Deposition by sputtering is generally performed as follows: Atoms of an inert gas such as Argon (Ar) are ionized into positive ions by a glow discharge. These positive ions are accelerated toward a cathode or target by an electric field and then impinged upon the target. As a result of the ionic bombardment, neutral atoms and ions are transferred from the target surface into a vacuum chamber due to the exchange of momentum there between. The liberated or sputtered atoms and ions are consequently deposited on a pre-selected substrate disposed in the vacuum chamber.

In planar-magnetron-sputtering, the cathode includes an array of permanent magnets arranged in a closed loop and mounted in a fixed position in relation to a flat target plate. Thus, the magnetic field is caused to travel in a closed loop, commonly referred to as a "race track," which establishes the path or region along which sputtering of the target material takes place. In the magnetron cathode, a magnetron field confines the glow discharge plasma and increases the path length of the electrons moving under the influence of the electric field. This results in an increase in the gas atom-electron collision probability and leads to a much higher sputtering rate than that obtained without the use of magnetic confinement. Further, the sputtering process can be accomplished at a much lower gas pressure.

In facing-targets-sputtering, the cathode consists of two opposing magnetron targets. Electrons are emitted from both target plates by applying voltage thereto. These electrons are confined between the target plates due to a magnetic field which promotes the ionization of the inert gas, thereby forming a plasma region. The positive ions of the inert gas excited in the plasma region are accelerated toward the target plates, whereby those accelerated particles violently impinge upon the target plates. The bombardment of the target plates by accelerated particles of the inert gas and ions thereof causes an emission of atoms from the material forming the plates. The substrate on which the film is to be disposed is placed around the plasma region, so that the bombardment of electrons and high energy negative ion particles, such as negative oxygen ions, against the thin film plane is avoided due to effective confinement of the plasma region by the magnetic field. This results in a decreased roughness of film surface and only a relatively small rise in substrate temperature. Furthermore, films with different composition can be prepared without the need to exchange targets by providing target plates made of different materials connected to independent power supplies. Facing-targets-sputtering has a lower sputtering rate than that of planar-magnetron-sputtering, because the former has a weaker magnetic field component parallel to the target surface than does the latter.

In multi-layer thin film structures, the deposition requirements of each layer may differ. For example, some of the layers may be required to be very thin and smooth, whereas other layers may require a specific rate of deposition.

It is an aim of the present invention, therefore, to provide a sputtering device for producing on a substrate, multi-layer film structures, of which a wide range of deposition requirements for each individual layer can be met.

SUMMARY OF THE INVENTION

According to a first aspect of the present invention, there is provided a sputtering device for depositing multi-layer films on a substrate, the sputtering device comprising at least one planar-magnetron-sputtering-cathode and at least one facing-targets-sputtering-cathode housed in a single vacuum chamber, and adapted such that each of the planar-magnetron-sputtering-cathode and each of the facing-targets-sputtering-cathode can be selectively positioned for sputtering deposition onto a substrate.

The combination of planar-magnetron-sputtering-cathodes and facing-targets-sputtering-cathodes in a single device has the advantage that a wide range of deposition requirements can be met. Each planar-magnetron-sputtering-cathode and each facing-targets-sputtering-cathode are preferably mounted for rotation about a common axis between a working position in which the respective cathode is used to deposit a layer on a substrate, and a non-working position in which the respective cathode is not used to deposit a layer on said substrate. Preferably, electrical connections to the planar-magnetron-sputtering-cathode and the pair of facing-targets-sputtering-cathode are shielded to atmospherically isolate them from the single vacuum chamber.

Moreover, cooling of the planar-magnetron-sputtering-cathode and the pair of facing-targets-sputtering-cathode is accomplished using a coolant fluid supplied via supply means. The cooling mechanisms are also preferably shielded to atmospherically isolate them from the single vacuum chamber.

According to a preferred embodiment, the planar-magnetron-sputtering-cathode and the facing-targets-sputtering-cathode can be positioned for sputtering deposition onto a substrate in an arbitrary sequence, and the device is adapted such that a substrate can be spun during deposition of a layer thereon. The device is preferably further adapted such that the distance between the surface of a substrate to be subject to deposition and the planar-magnetron-sputtering-cathode and/or the facing-targets-sputtering-cathode can be varied. The device is also preferably adapted such that the distance between the two facing targets of the facing-targets-sputtering-cathode can be varied. In a preferred embodiment, the two facing targets are mounted for movement along a common rail such that the distance between them can be varied.

The sputtering device further preferably comprises one or more of the following components: a load-lock component which can accommodate a plurality of substrates; an in situ measuring instrument having an incident source and a detecting source which are arranged to be in a common plane with a substrate during sputtering deposition onto said substrate; and an assisted ion source, electron source, or light source for assisting the deposition by the planar-magnetron-sputtering-cathode or the facing-targets-sputtering-cathode.

According to a second aspect of the present invention, there is provided a method for depositing a film on a substrate using the device described above wherein the substrate is spun whilst rotating the planar-magnetron-sputtering-cathode or the facing-targets-sputtering-cathode over the substrate through the working position for sputtering deposition onto the substrate.

According to a third aspect of the present invention, there is provided a sputtering device for depositing multi-layer films on a substrate, the sputtering device comprising a first vacuum chamber, at least one planar-magnetron-sputtering-cathode and at least one facing-targets-sputtering-cathode for sputtering deposition onto a substrate in the first vacuum chamber. The sputtering device is adapted such that a substrate can be moved within the first vacuum chamber between a position for deposition thereon using the planar-magnetron-sputtering-cathode and a position for deposition thereon using the facing-targets-sputtering-cathode, and further adapted such that the planar-magnetron-sputtering-cathode or the pair of facing-targets-sputtering-cathode can be atmospherically isolated from each other and from the first vacuum chamber.

The sputtering device is preferably adapted such that the planar-magnetron-sputtering-cathode and the facing-targets-sputtering-cathode can be positioned for sputtering deposition onto the substrate in an arbitrary sequence, and/or such that at least one of the planar-magnetron-sputtering-cathode and the facing-targets-sputtering-cathode can be exchanged for another cathode.

The sputtering device preferably further comprises a heating station, and is adapted such that a substrate can be moved to a position within the first vacuum chamber where it may be subject to heating using the heating station.

According to a preferred embodiment, the device is adapted such that a substrate can be positioned at a range of distances from the planar-magnetron-sputtering-cathode and/or the facing-targets-sputtering-cathode. The device is preferably further adapted such that the distance between the two facing targets of the facing-targets-sputtering-cathode can be changed. This can be achieved by mounting the two facing targets for movement along a common rail.

In a preferred embodiment, the planar-magnetron-sputtering-cathode and the facing-targets-sputtering-cathode are positioned such that a substrate can be moved into a position in which simultaneous sputtering deposition can be carried out with respect to two opposite sides of the substrate. In one embodiment, the planar-magnetron-sputtering-cathode and the facing-targets-sputtering-cathode are provided in an open in-line configuration, i.e. they are positioned such that a substrate can be moved between the planar-magnetron-sputtering-cathode and the facing-targets-sputtering-cathode by moving the substrate in a linear fashion. In an alternative embodiment, the planar-magnetron-sputtering-cathode and the facing-targets-sputtering-cathode are provided in a closed in-line configuration, i.e. they are positioned such that a substrate can be moved between the planar-magnetron-sputtering-cathode and the facing-targets-sputtering-cathode by movement around a continuous path.

The device preferably includes a substrate holder that is mounted for movement between the planar-magnetron-sputtering-cathode and the facing-targets-sputtering-cathode, and that is adapted for holding a substrate such that the substrate can be spun on the substrate holder. In a preferred embodiment, the substrate holder is mounted for rotation between the planar-magnetron-sputtering-cathode and the facing-targets-sputtering-cathode. The deposition is carried out whilst moving (by rotation, for example) the substrate holder through a position in which the substrate faces the working cathode, and spinning the substrate on the substrate holder. This method of deposition is a fourth aspect of the present invention.

The sputtering device according to the third aspect of the present invention preferably comprises a plurality of planar magneton sputtering cathodes and/or a plurality of facing-targets-sputtering-cathodes, and is adapted such that two or more of the plurality of planar-magnetron-sputtering-cathodes and/or two or more facing-targets-sputtering-cathodes can be atmospherically isolated together from the first vacuum chamber.

BRIEF DESCRIPTION OF THE DRAWINGS

Embodiments of the present invention are described in the following Detailed Description, by way of example only, with reference to the accompanying drawings, wherein.

DETAILED DESCRIPTION OF THE PREFERRED EXEMPLARY EMBODIMENTS OF THE PRESENT INVENTION

Figure 1:
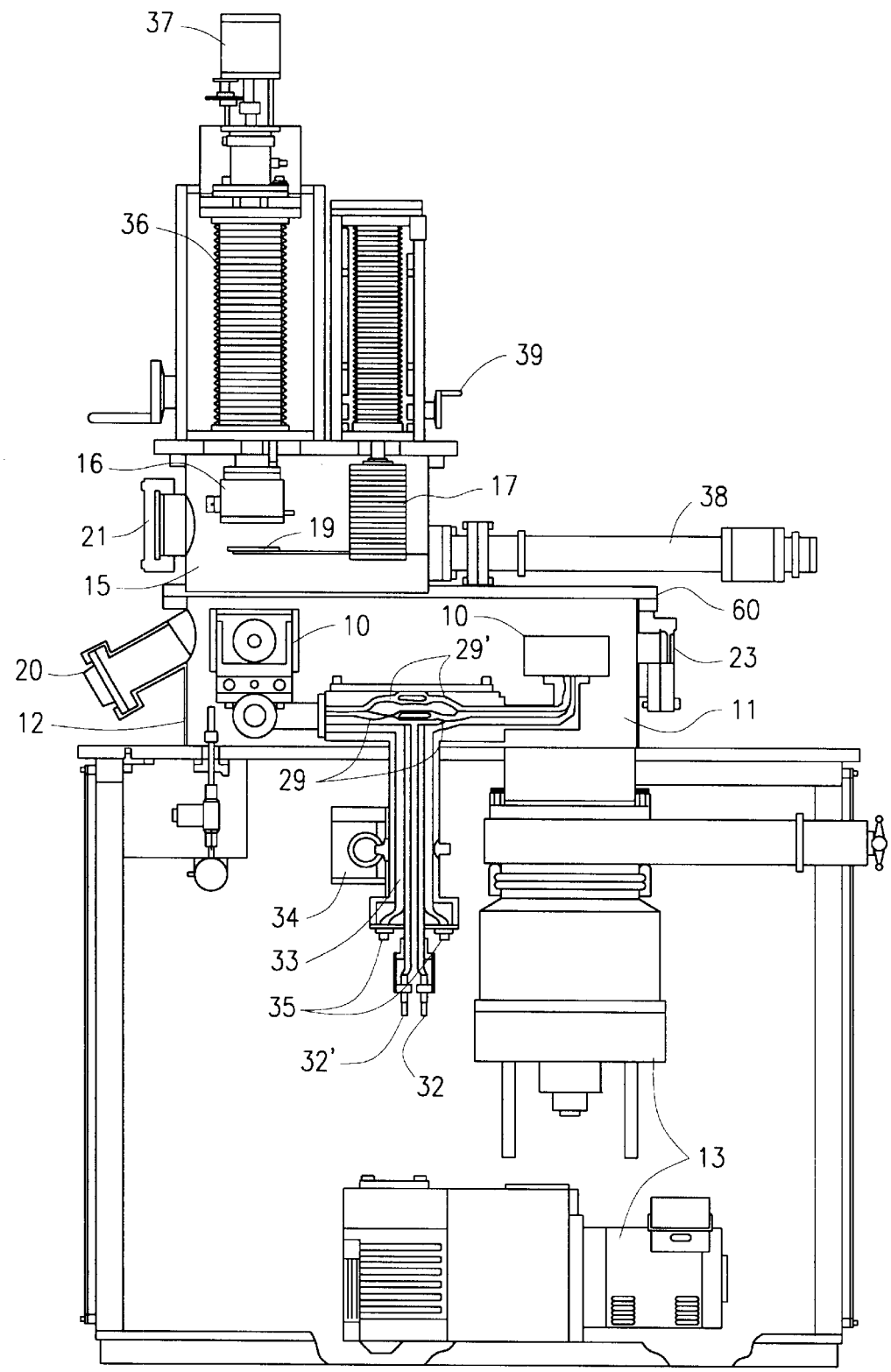
FIG. 1 is a cross-sectional view of a first embodiment of a device in accordance with the present invention.

A cross-sectional view of a first embodiment of a device in accordance with the present invention is illustrated in FIG. 1. A cathode assembly 10 is positioned in a sputtering chamber 11 enclosed by a chamber housing 12 which can be evacuated by a suitable vacuum pumping means 13 and can be back-filled by a gas-supplying component 14 with a suitable gas such as Argon. On the left side of the upper chamber 15 is a substrate holder 16. On the right side of the upper chamber is a cassette 17 accommodating several substrates.

Figure 2:
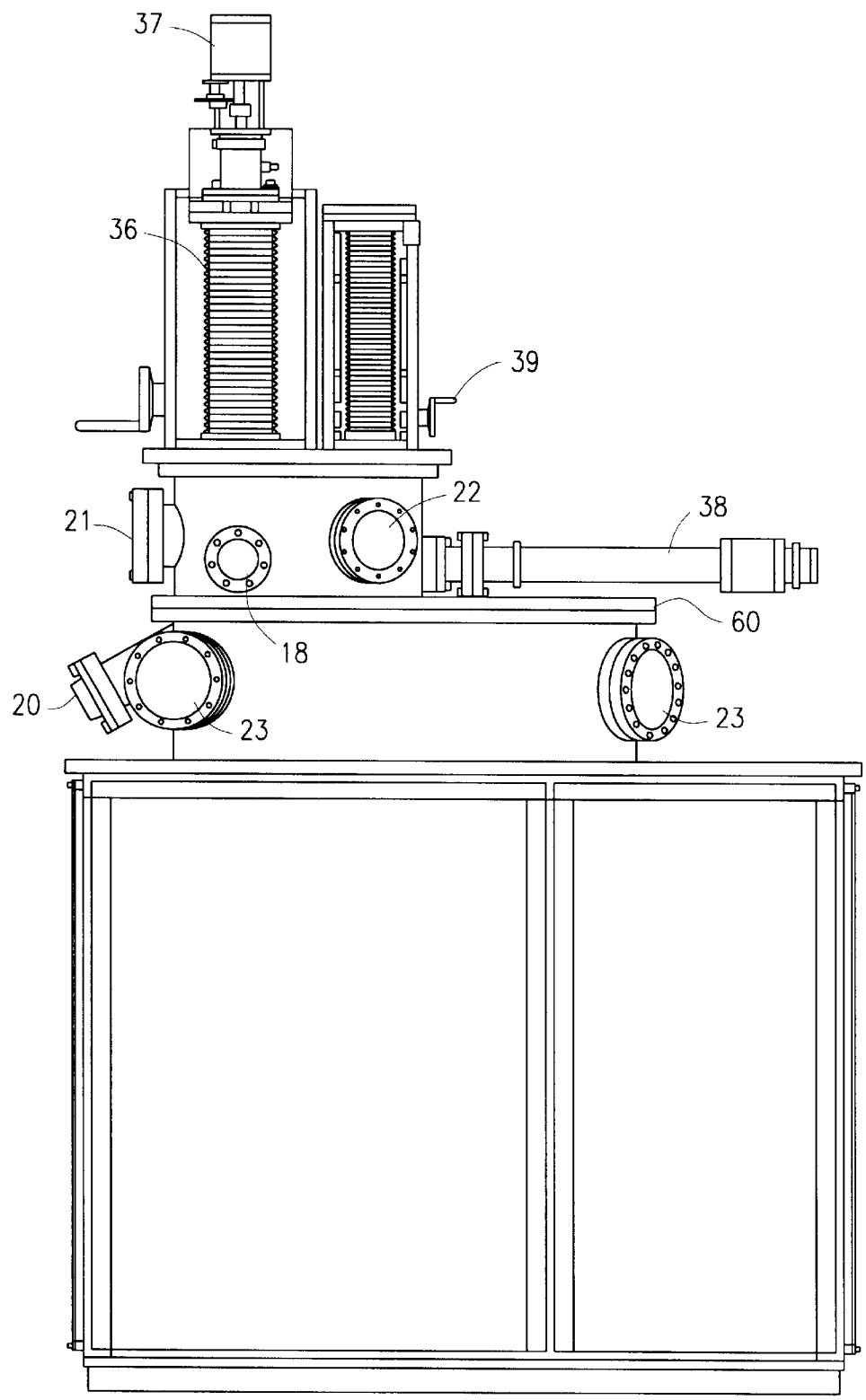
FIG. 2 is a front view of the device shown in FIG. 1.

A front view of the device is illustrated in FIG. 2. In the wall of the upper vacuum chamber, a first set of two quartz flanges 18 (only one is shown) are mounted to oppose each other. The center axes of the flanges 18 are oriented to be at an angle with respect to the surface of the substrate 19 (see FIG. 1) during sputtering, and can be used for in-situ optical analysis such as Ellipsometry analysis and optical multi-channel analysis of the film. The first set of two quartz flanges 18 are positioned to be in the same plane as substrate 19 during planar-magnetron-sputtering-deposition or facing-targets-sputtering-deposition.

On the left wall of the sputtering vacuum chamber is mounted a first flange 20 for mounting an ion beam source, a laser source, or an electron source. The center axis of the first flange 20 is oriented to be at an angle with respect to the substrate 19 surface, such that radiation from the source is incident obliquely on the substrate 19 surface to perform an assisted deposition together with planar-magnetron-sputtering or facing-targets-sputtering.

On the left side wall of the upper vacuum chamber, a second flange 21 with a suitable diameter for future application is mounted. The center axis of the flange is aligned with the manipulator 38. In the wall of the upper vacuum chamber a quartz flange 22 facing the cassette 17 is used as a view port for load-lock operations. In the wall of the sputtering vacuum chamber, a second set of two quartz flanges 23 are used as view ports for sputtering observation.

Figure 3:
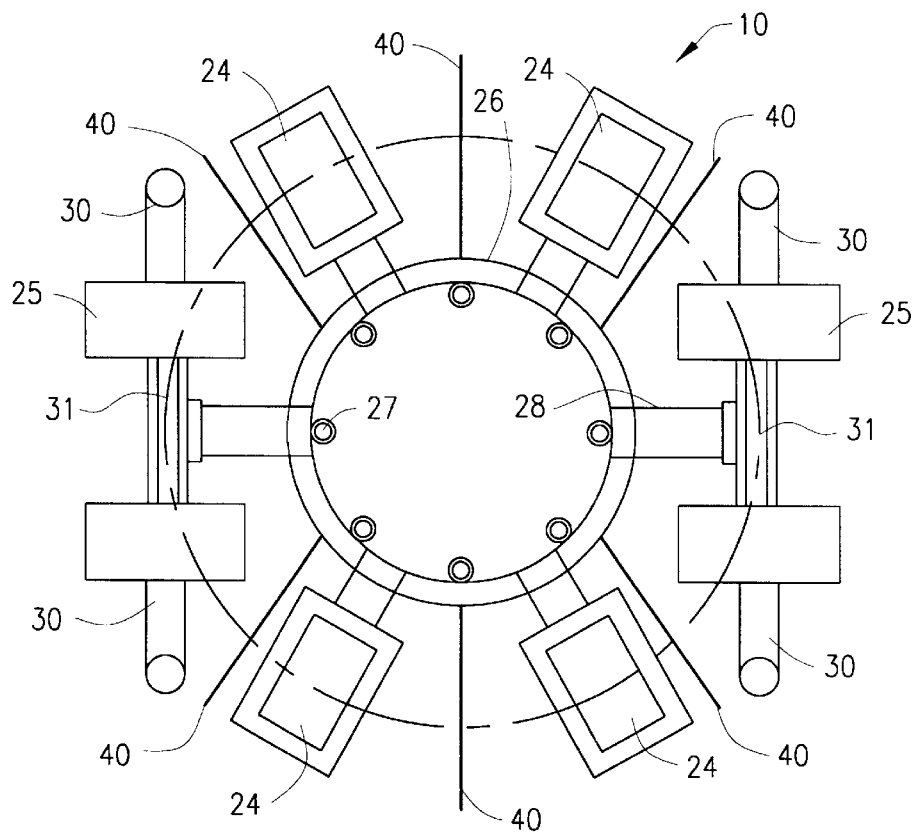
FIG. 3 is a plan view of the cathode assembly of the device shown in FIG. 1.
Figure 4:
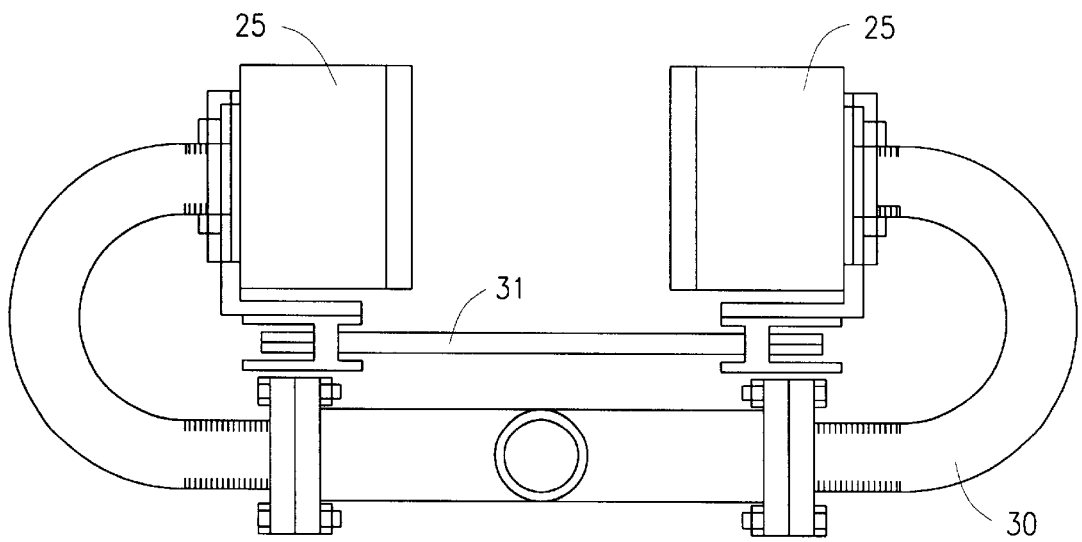
FIG. 4 is a cross-sectional view of a facing target cathode assembly.

The cathode assembly 10 is illustrated in FIG. 3. It includes several planar-magnetron-cathodes 24 (only 4 are shown) and several pairs of facing-targets-sputtering-cathodes 25 (only 2 are shown). The centers of all planar-magnetron-cathodes 24 and the symmetric centers of the facing-targets-sputtering-cathodes 25 lie on a circumference with a suitable diameter as indicated by the dashed line. The planar-magnetron-cathodes 24 face upwards, whilst the facing-targets-sputtering-cathodes 25 face sidewards. Two facing targets of the facing-targets-sputtering-cathodes 25 stand face to face with each other. In the center of the cathode assembly 10 is a box 26, of which the upper cover is a flange mounted on the cylinder of the box 26 by a plurality of fasteners 27. Between the cathodes 24, 25 and the box 26 is a tube 28 having one end mounted on the box 26, and the other on the backside of the cathodes 24 and 25. Each tube contains one cable 35 used for inputting DC or RF sputtering power 28, and two tubes 29, 29' through which coolant such as water flows in order to transfer and remove the heat generated in the targets during sputtering. Between the backside of the facing-targets-cathode 25 and the end of tube 28 distant from the box 26 is provided a bellows 30. With the combination of the bellows and a rail 31, the latter located below the facing-targets-sputtering-cathodes 25 on which these cathodes 25 move, the work distance between the facing targets of the facing-targets-sputtering-cathodes 25 can be adjusted. Between two neighboring targets are shutters 40 connected to the box 26 to avoid the cross contamination of the targets.

To save space in the box 26, all water-in pipes 29 (only two are shown) for the cathode cooling are integrated into a single water-in pipe 32 and all water-out pipes 29' (only two are shown) for the cathode cooling are integrated into a single water-out pipe 32'. Thus, only one water-in pipe and one water-out pipe and several cables 35 (only two shown) pass through the hollow axis 33 of the cathode assembly.

The hollow axis 33 is connected to the bottom cover of the box 26. This hollow axis 33 performs two functions. First, it offers a passage for cables and coolant tube. Secondly, it acts as an axis of the cathode assembly. Nearby the hollow axis 33 is a step-motor 34, which is controlled by a computer via a PID controller (not shown). The step-motor 34 is connected to the hollow axis 33 by a driving gear. An atmosphere remains within the bellows 30, the tube 28, and the hollow axis 33.

The cathode assembly 10 can rotate from 0° to 360° (or −180° to +180°). By using rotating coolant feedthrough and electric brushes for the cables on the bottom of the hollow axis 33, the cathode assembly can rotate between any angle range. Between the substrate holder and the cathodes is a shutter (not shown). The shutter and the power supplies used for sputtering are controlled by the computer. The rotating rate and angle position of the cathode assembly 10, as well as the sputtering parameters such as input power, working gas pressure, and substrate bias are also controlled by the computer. During deposition, one planar-magnetron-cathode 24 or one facing-targets-sputtering-cathode 25 facing the substrate 19 rotates below the substrate. By adjusting the facing time or rotating rate of the cathode assembly 10, the thickness of the film to be coated on the substrate can be controlled. By adjusting the input power, working gas, and substrate temperature, the microstructure can be controlled.

The substrate holder 16 can be heated to as high as 850° C. by a lamp provided in a space within the head of the substrate holder 16. The temperature is controlled by a TC/PID temperature controller (not shown). Above the space is a water-cool box which transfers radiated heat upwards, thereby keeping the sealing O-ring, located between the substrate holder head and the water-cool box, at a low temperature. Above the upper chamber 15 is provided a bellows 36 with a manual drive for moving the substrate heater up and down to a suitable position so as to adjust the distance between the substrate and the cathodes 24, 25, and to index the clamp of the holder to the manipulator so as to achieve a load-lock of substrates in the cassette 17. Within the bellows 36 is a hollow pipe containing the water-in and water-out pipes and cables for substrate RF/DC bias, thermal couple, and the said lamp. To achieve a uniform film, the substrate 19 is spun during sputtering by a driving motor 37 provided on the top of the substrate holder. To improve the microstructure of the film to be coated on the substrate 19, a DC or RF bias is applied to the substrate 19.

If low substrate temperature deposition is required, the substrate holder 16 can be replaced by a low temperature substrate holder. This low temperature substrate holder has the same size as the substrate holder 16 discussed above, but houses a liquid nitrogen trap in its head, rather than a heating lamp. The temperature of the substrate can be lowered to 77 K.

The load-lock component includes a cassette 17 capable of accommodating several substrates, a manipulator 38 which can be manually moved in the horizontal direction, and a manual bellows drive 39 which can lift the cassette 17 vertically to a suitable position. When loading and unloading a substrate sample onto or from the substrate holder 16, the clamp of the substrate holder 16, the cassette 17, and the manipulator 38 are aligned. Between the substrate holder and the cassette is a stationary shutter (not shown) which prevents the sputtered particles from entering the cassette 17 space.

In order to prepare a multi-layer (2 or more layers) film structure with good uniformity, it is preferred to move the substrate relative to the targets as the substrate spins. Means for spinning and rotating a substrate with respect to fixed subject is commercially available, but the mechanical construction is rather complicated and the cost is rather high. The present invention overcomes these disadvantages by separating the spinning motion from the rotating motion of the substrate. In operation, the substrate is spun as the cathode or target is rotated. The former motion ensures transverse uniformity, while the latter achieves a longitudinal uniformity of the film.

The operating sequence is as follows: open the sputtering chamber 11 by a lift from the flange 40, place several samples in the cassette 17, and shut the sputtering chamber 11. Evacuate the chamber to a desired background vacuum. Heat the substrate to a given temperature and sustain for several minutes to make the temperature uniform. Before deposition, let the cathode assembly 10 rotate to a suitable position. A suitable RF/DC voltage is applied to one of the targets (for example, planar-magnetron-sputtering targets) and the target starts to sustain glow discharge. After 5–10 minutes of pre-sputtering, one planar-magnetron-cathode 24 or one facing-targets-sputtering-cathode 25 is moved to face the substrate 19 for some time or rotate below the substrate at a given rotating rate. By adjusting the facing time or rotating rate of the cathode assembly 10, the thickness of the film to be coated on the substrate can be controlled.

Figure 5:
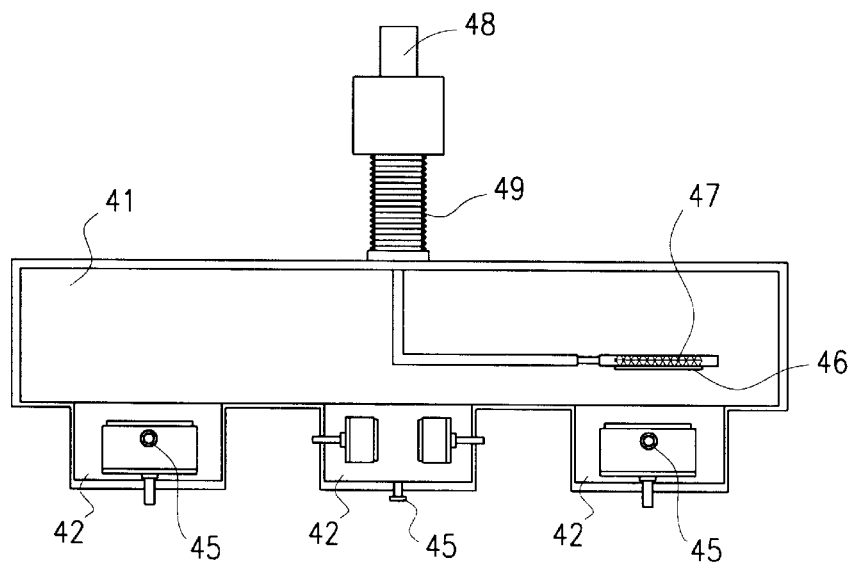
FIG. 5 is a cross-sectional view of a second embodiment of a device in accordance with the present invention.
Figure 6:
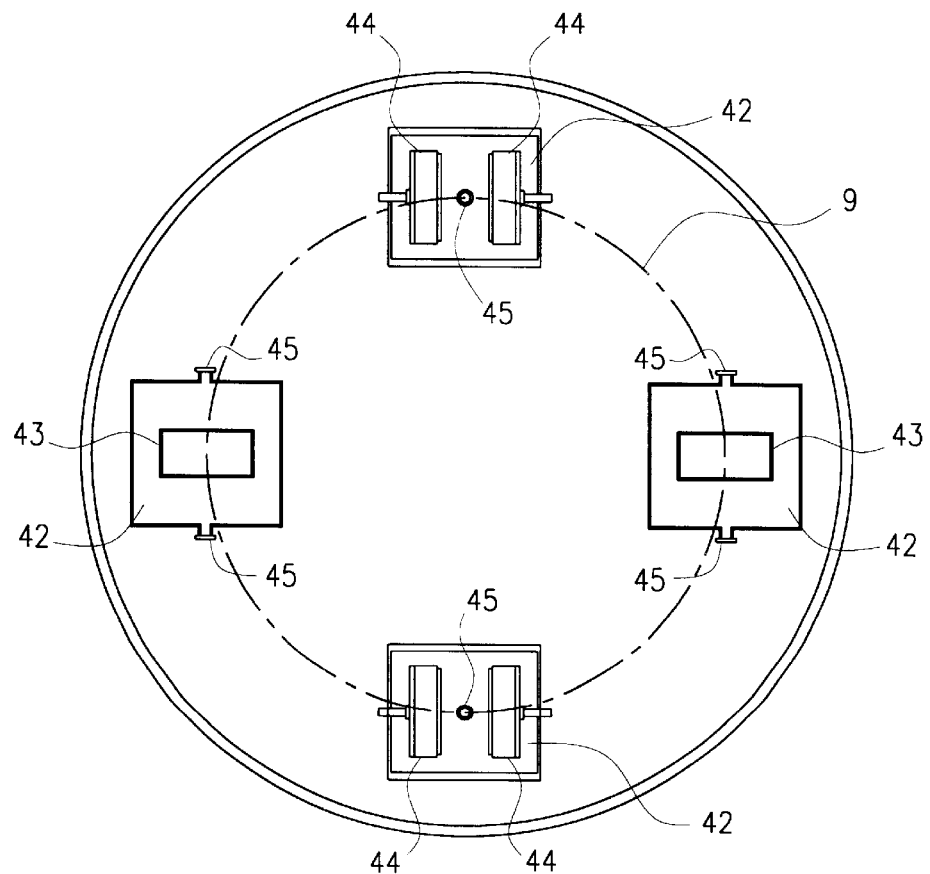
FIG. 6 is a cross-sectional view of the cathode stations of the device shown in FIG. 5.

In the second embodiment of the device, all cathodes are fixed when sputtering is carried out, as illustrated in FIG. 5 and FIG. 6. Below the main chamber 41 are provided several small chambers or stations 42 (only 4 are shown). The symmetric centers of all the stations 42 are positioned on a circle's circumference 9 having a suitable diameter, as shown in FIG. 6. In each station is provided a planar-magnetron-sputtering-cathode 43 or a pair of facing-targets-sputtering-cathode 44. The distance between two facing targets in each pair of facing-targets-sputtering-cathode can be varied within a suitable range via the feedthrough. The main chamber and each station have their own vacuum pumping means and gas-supplying component (not shown). Each station has the same dimensions, thereby allowing for the exchange of stations with one another. In addition, certain positions in the station housing are provided with black flanges 45 having a size equivalent to that of the feedthrough of the two types of cathodes. Thus, any station can perform planar-magnetron-sputtering or facing-targets-sputtering by inserting the respective cathode.

Above the cathode in the main chamber 41 is positioned a substrate 46 held by a heated substrate holder 47. The substrate holder is powered to rotate on its center axis via a step-motor 48 mounted on the top of the main chamber. Between the top cover of the main chamber and the step-motor is a bellows 49, by which the distance between the substrate surface and each of the planar-magnetron-sputtering-cathodes 43 and the facing-target-sputtering-cathodes 44 can be adjusted over a suitable range. One or more of the sputtering stations can be converted into a substrate heating station by simply replacing the cathode(s) in the sputtering station with a heating means. Moreover, if an additional set of cathodes is fixed in the sputtering stations at suitable positions, films can be deposited on both sides of a substrate. In this case, substrate heating is carried out by a substrate heating station rather than by means of a heater positioned behind the substrate.

Figure 7A:
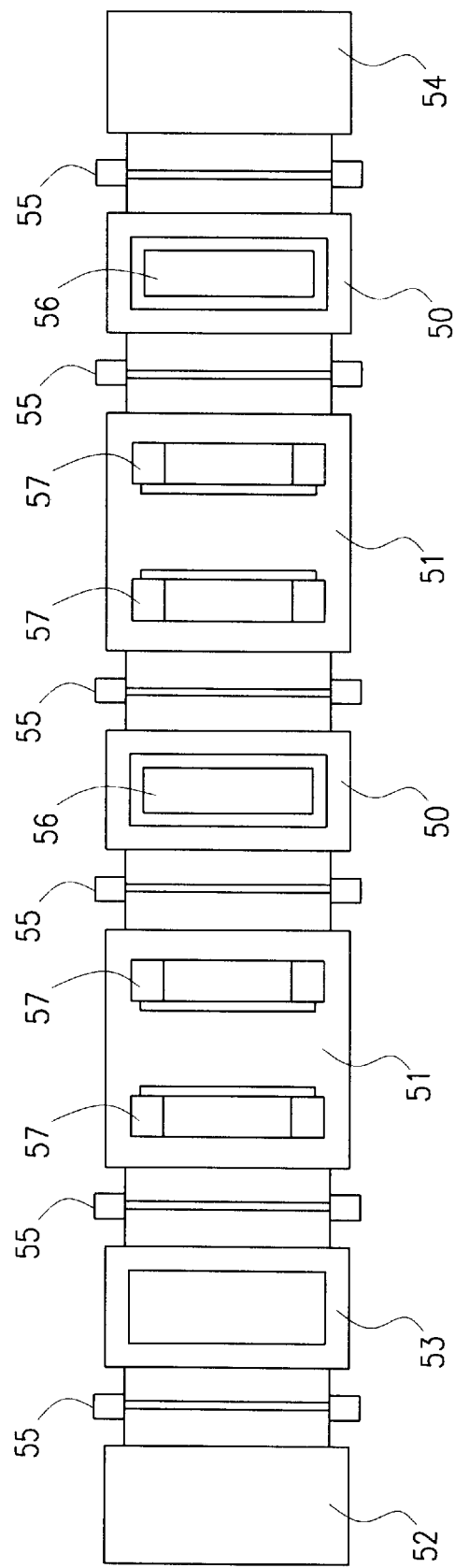
FIG. 7a is a cross-sectional view of a cathode third arrangement of a embodiment of a device in accordance with the present invention.

According to a third embodiment, the cathode assembly has an open in-line configuration as illustrated in FIG. 7a. It consists of several planar-magnetron-sputtering stations 50 (only two shown), several facing-targets-sputtering stations 51 (only two shown), a sample-loading station 52, a pre-treating station 53, and a sample-unloading station 54. Each sputtering station may contain several pairs of facing targets 57 (only one pair shown) or several planar magnetron targets 56 (only one shown). All cathodes are fixed during deposition of film. In the pre-treating station 53, heating of the substrate or RF etching of the substrate is carried out. The substrates are transferred on a sample pallet from station to station by a driving means( not shown). Between two neighbouring stations is provided a passage for transferring substrates. Each station is separated from one another by a vacuum valve 55. Each station has the same connection size, so that the arraying sequence of the stations can be exchanged. For example, a facing-targets-sputtering station can be exchanged with a planar sputtering station, and vice versa. Black flanges having the same size as that of the feed through of the two kinds of cathodes are provided at appropriate positions within the station housing, such that any station can perform either planar-magnetron-sputtering or facing-targets-sputtering just by exchanging one kind of cathode for the other. Double-sided coatings can also be prepared if a further set of cathodes are fixed in the sputtering stations at suitable positions.

Figure 7B:
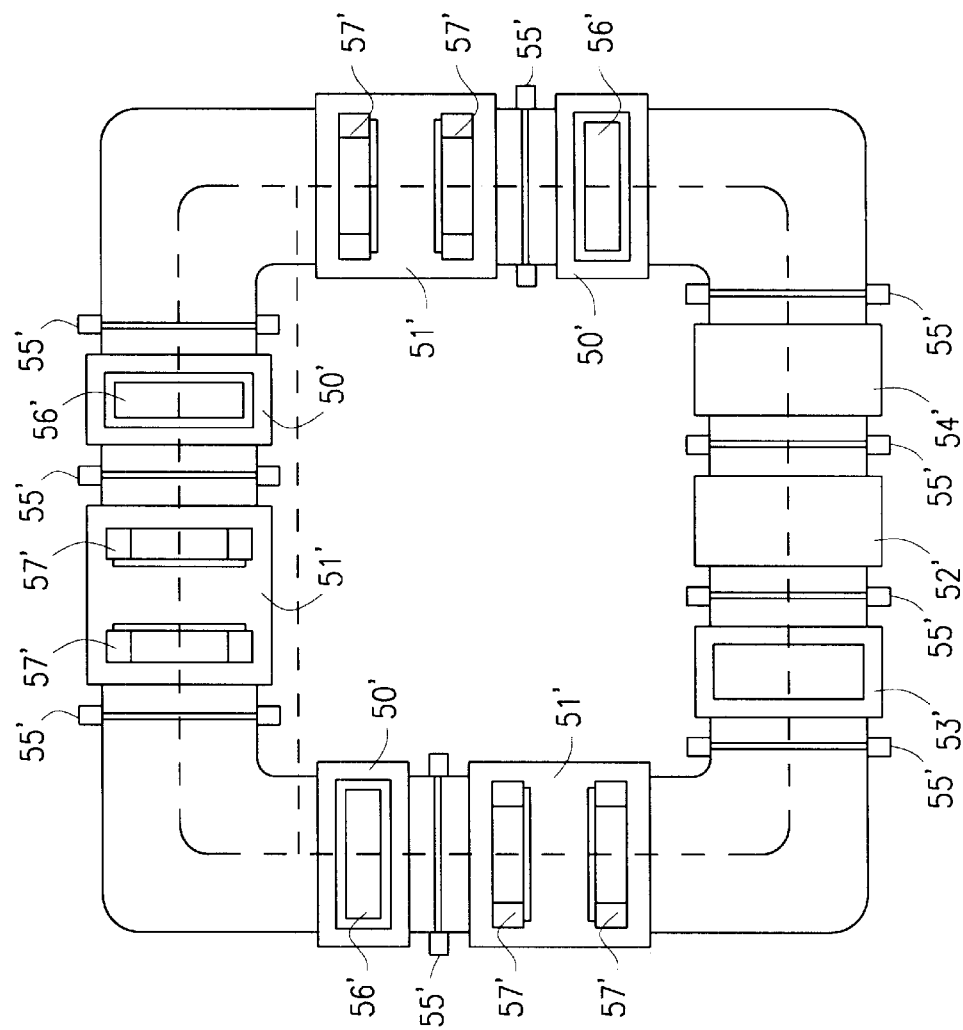
FIG. 7b is a cross-sectional view of a cathode assembly of a fourth embodiment of a device in accordance with the present invention.

A cathode assembly according to a fourth embodiment of the device is illustrated in FIG. 7b. In contrast to the open in-line configuration illustrated in FIG. 7a, FIG. 7b illustrates a closed in-line configuration. It is composed of several planar-magnetron-sputtering-stations 50', (only three are shown), several facing-targets-sputtering-stations 51' (only three are shown), a sample-loading station 52', a pre-treating station 53', and a sample-unloading station 54'. Each sputtering station may contain several pairs of facing targets 57' (only one pair is shown) or several planar-magnetron-targets 56' (only one shown). All cathodes are fixed during film deposition. In the pre-treating station 53', heating of the substrate, or RF etching of the substrate, is carried out. The substrates are transferred on a sample pallet from station to station via a driving means (not shown) along a track indicated by a dashed line in FIG. 7b. Between two neighboring stations exists a passage for transferring substrates, each station separated from another by a vacuum valve 55'. Each station has the same connection size, so that the arraying sequence of the stations can be exchanged. For example, a facing-targets-sputtering-station can be exchanged with a planar-magnetron-sputtering-station, and vice versa. If black flanges having the same size of that of the feedthrough of the two kinds of cathodes, are spared or provided at suitable positions, any station can perform planar-magnetron-sputtering or facing-targets-sputtering just by exchanging one type of cathode for another. Double-sided coatings can also be prepared if an additional set of cathodes are fixed in the sputtering stations at suitable positions.

Although the present invention has been described in terms of the presently preferred embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

What is claimed is:

1. A sputtering device for depositing multi-layer films on a substrate, said sputtering device comprising:
    at least one vacuum chamber for containing said substrate for sputtering deposition;
    at least one planar-magnetron-sputtering-cathode housed in said vacuum chamber;
    at least one facing-targets-sputtering-cathode housed in said vacuum chamber wherein each of said planar-magnetron-sputtering-cathode and each of said facing-targets-sputtering-cathode can be selectively positioned for sputtering deposition onto said substrate.

2. A sputtering device according claim 1 wherein said at least one planar-magnetron-sputtering-cathode and said at least one facing-targets-sputtering-cathode are mounted for rotation about a common axis between a cathode working position in which deposition of a film layer on said substrate can be performed, and a cathode non-working position in which no deposition of said film layer on said substrate can be performed.

3. A sputtering device according to claim 1 wherein electrical connections to said at least one planar-magnetron-sputtering-cathode and to said at least one facing-targets-sputtering-cathode are shielded to atmospherically isolate said electrical connections from said at least one vacuum chamber.

4. A sputtering device according to claim 1 further comprising:
    means for cooling said at least one planar-magnetron-sputtering-cathode and said at least one facing-targets-sputtering-cathode using a coolant fluid supplied via supply means, said means for cooling shielded to atmospherically isolate said means for cooling from said at least one vacuum chamber.

5. A sputtering device according to claim 1 further adapted such that said at least one planar-magnetron-sputtering-cathode and said at least one facing-targets-sputtering-cathode can be positioned for sputtering deposition onto said substrate in an arbitrary sequence.

6. A sputtering device according to claim 1 further adapted such that said substrate can be spun during deposition of a film layer thereon.

7. A sputtering device according to claim 1 further adapted such that a distance between a surface of said substrate to be subject to deposition and said at least one planar-magnetron-sputtering-cathode can be varied.

8. A sputtering device according to claim 1 further adapted such that a distance between a surface of said substrate to be subject to deposition and said at least one facing-targets- sputtering-cathode can be varied.

9. A sputtering device according to claim 1 further adapted such that a distance between two facing targets of said at least one facing-targets-sputtering-cathode can be varied.

10. A sputtering device according to claim 9 wherein said two facing targets are mounted for movement along a common rail, such that said distance between said two facing targets can be varied.

11. A sputtering device according to claim 1 further comprising:
a load-lock component housed within said at least one vacuum chamber, said load-lock component capable of accommodating a plurality of substrates.

12. A sputtering device according to claim 1 further comprising:
an in situ measuring instrument having an incident source and a detecting source which are arranged to be in a common plane with said substrate during said sputtering deposition onto said substrate.

13. A sputtering device according to claim 1 further comprising:
an assisted ion source for assisting the deposition by at least one of said at least one planar-magnetron-sputtering-cathode and said at least one facing-targets-sputtering-cathode.

14. A sputtering device according to claim 1 further comprising:
an assisted electron source for assisting the deposition by at least one of said at least one planar-magnetron-sputtering-cathode and said at least one facing-targets-sputtering-cathode.

15. A sputtering device according to claim 1 further comprising:
an assisted light source for assisting the deposition by at least one of said at least one planar-magnetron-sputtering-cathode and said at least one facing-targets-sputtering-cathode.

16. A sputtering device according to claim 2, wherein said substrate is spun whilst rotating at least one of said at least one planar-magnetron-sputtering-cathode and said at least one facing-targets-sputtering-cathode over the substrate, in said cathode working position.

17. A sputtering device for depositing multi-layer films on a substrate, said device comprising:
at least one single vacuum chamber for containing said substrate for sputtering deposition;
at least one planar-magnetron-sputtering-cathode for said sputtering deposition onto said substrate;
at least one facing-targets-sputtering-cathode for said sputtering deposition onto said substrate;
wherein said substrate can be moved within said single vacuum chamber between a first position for deposition thereon using said at least one planar-magnetron-sputtering-cathode, and a second position for deposition thereon using said at least one facing-targets-sputtering-cathode, and further adapted such that said at least one planar-magnetron-sputtering-cathode and said at least one facing-targets-sputtering-cathode can be atmospherically isolated from each other and said single vacuum chamber.

18. A sputtering device according to claim 17 further adapted such that said at least one planar-magnetron-sputtering-cathode and said at least one facing-targets-sputtering-cathode can be positioned for sputtering deposition onto said substrate in an arbitrary sequence.

19. A sputtering device according to claim 17 further adapted such that at least one of said at least one planar-magnetron-sputtering-cathode and said at least one facing-targets-sputtering-cathode can be exchanged for another cathode or pair of cathodes.

20. A sputtering device according to claim 17 further comprising:
a heating station, wherein the sputtering device is adapted such that said substrate can be moved to a third position within said single vacuum chamber where it may be subject to heating using the heating station.

21. A sputtering device according to claim 17 further adapted such that said substrate can be positioned at a range of distances from said at least one planar-magnetron-sputtering-cathode for sputtering deposition using said at least one planar-magnetron-sputtering-cathode.

22. A sputtering device according to claim 17 further adapted such that a distance between a surface of said substrate subject to deposition and said at least one facing-targets-sputtering-cathode, can be varied.

23. A sputtering device according to claim 17 further adapted such that a distance between two facing targets of said at least one facing-targets-sputtering-cathode can be varied.

24. A sputtering device according to claim 23 wherein said two facing targets are mounted for movement along a common rail.

25. A sputtering device according to claim 17 wherein said at least one planar-magnetron-sputtering-cathode and said at least one facing-targets-sputtering-cathode are positioned such that said substrate can be moved into a fourth position in which simultaneous sputtering deposition can be carried out with respect to two opposite sides of said substrate.

26. A sputtering device according to claim 17 wherein said at least one planar-magnetron-sputtering-cathode and said at least one facing-targets-sputtering-cathode are provided in an open in-line configuration.

27. A sputtering device according to claim 17 wherein said at least one planar-magnetron-sputtering-cathode and said at least one facing-targets-sputtering-cathode are provided in a closed in-line configuration.

28. A sputtering device according to claim 17 further comprising:
a substrate holder mounted for movement between said at least one planar-magnetron-sputtering-cathode and said at least one facing targets sputtering cathode, said substrate holder adapted for holding said substrate such that said substrate can be spun on said substrate holder during sputtering deposition.

29. A sputtering device according to claim 28 wherein said substrate holder is mounted for rotation between said at least one planar-magnetron-sputtering-cathode and said at least one facing-targets-sputtering-cathode.

30. A sputtering device according to claim 17, wherein said at least one planar-magnetron-sputtering-cathode comprises:
    a plurality of planar-magnetron-sputtering-cathodes, wherein said sputtering device is adapted such that two or more of said plurality of planar-magnetron-sputtering-cathodes can be atmospherically isolated together from said single vacuum chamber.

31. A sputtering device according to claim 17, wherein said at least one facing-targets-sputtering-cathodes comprises:
    a plurality of facing-targets-sputtering-cathodes, wherein said sputtering device is adapted such that two or more of said plurality of facing-targets-sputtering-cathodes can be atmospherically isolated together from said single vacuum chamber.

32. The sputtering device according to claim 17, wherein said sputtering deposition is carried out using one of said at least one planar-magnetron-sputtering-cathode or said at least one facing-targets-sputtering-cathode, as a working cathode.

33. The sputtering device according to claim 28, wherein said substrate holder is moved such that said substrate spins on said substrate holder while said substrate faces said at least one planar-magnetron-sputtering-cathode.

34. The sputtering device according to claim 28, wherein said substrate holder is moved such that said substrate spins on said substrate holder while said substrate faces said at least one facing-targets-sputtering-cathode.

35. The sputtering device according to claim 29, wherein said substrate holder is rotated such that said substrate spins on said substrate holder while said substrate faces said at least one planar-magnetron-sputtering-cathode.

36. The sputtering device according to claim 29, wherein said substrate holder is rotated such that said substrate spins on said substrate holder while said substrate faces said at least one facing-targets-sputtering-cathode.

37. A method of depositing a layer of film on a substrate using a sputtering device, said method comprising the steps of:

housing said substrate within a single vacuum chamber;
    positioning at least one planar-magnetron-sputtering-cathode and at least one facing-targets-sputtering-cathode for sputtering deposition onto said substrate;
    spinning said substrate about a central axis; and
    rotating at least one of said at least one planar-magnetron-sputtering-cathode and said at least one facing-targets-sputtering-cathode over said substrate through a cathode working position for sputtering deposition onto said substrate.

38. The method according to claim 37, further comprising the step of:
    cooling said at least one planar-magnetron-sputtering-cathode and said at least one facing-targets-sputtering-cathode using a coolant fluid.

39. The method according to claim 38, further comprising the step of:
    supplying said coolant fluid via a supply means, said supply means shielded to atmospherically isolate said supply means from said single vacuum chamber.

40. The method according to claim 37, wherein the step of positioning further comprises the step of:
    adapting said at least one planar-magnetron-sputtering-cathode and said at least one facing-targets-sputtering-cathode for sputtering deposition onto said substrate in an arbitrary sequence.

41. The method according to claim 37, further comprising the step of:
    varying distance between a surface of said substrate and said at least one planar-magnetron-sputtering-cathode.

42. The method according to claim 37, further comprising the step of:
    varying distance between a surface of said substrate and said at least one facing-targets-sputtering-cathode.

43. The method according to claim 37, further comprising the step of:
    varying distance between two facing targets of said at least one facing-targets-sputtering-cathode.

* * * * *